(12) United States Patent
Li (10) Patent No.: US 10,447,974 B2
(45) Date of Patent: Oct. 15, 2019

(54) SYSTEM FOR DETERMINING DEVICE LOCATION DATA IN A DATA CENTER

(71) Applicant: QUANTA COMPUTER INC., Taoyuan (TW)

(72) Inventor: Yung-Fu Li, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 43 days.

(21) Appl. No.: 15/457,062

(22) Filed: Mar. 13, 2017

(65) Prior Publication Data

US 2018/0262722 A1  Sep. 13, 2018

(51) Int. Cl.
| H04N 7/18 | (2006.01) |
| H05K 7/14 | (2006.01) |
| G06Q 10/08 | (2012.01) |
| H04L 12/24 | (2006.01) |
| G06K 9/18 | (2006.01) |

(52) U.S. Cl.
CPC ........... *H04N 7/185* (2013.01); *G06Q 10/087* (2013.01); *H04L 41/0886* (2013.01); *H04L 41/0889* (2013.01); *H05K 7/1498* (2013.01); *G06K 9/18* (2013.01)

(58) Field of Classification Search
CPC combination set(s) only.
See application file for complete search history.

(56) References Cited

U.S. PATENT DOCUMENTS

| 7,857,214 | B2 | 12/2010 | Saliaris | |
| 2002/0091463 | A1* | 7/2002 | Piazza | B65G 1/1371 |
| | | | | 700/213 |
| 2011/0047263 | A1 | 2/2011 | Martins et al. | |
| 2011/0077795 | A1* | 3/2011 | VanGilder | G06F 1/206 |
| | | | | 700/300 |
| 2011/0084839 | A1 | 4/2011 | Groth et al. | |
| 2012/0179641 | A1* | 7/2012 | Ishioka | G06F 16/58 |
| | | | | 706/54 |
| 2014/0258052 | A1* | 9/2014 | Khuti | G06F 16/50 |
| | | | | 705/28 |
| 2015/0058473 | A1* | 2/2015 | Grande | H04L 41/12 |
| | | | | 709/224 |

(Continued)

FOREIGN PATENT DOCUMENTS

| CN | 103606051 A | 2/2014 |
| CN | 105210381 A | 12/2015 |
| TW | 201333842 A | 8/2013 |

OTHER PUBLICATIONS

TW Office Action for Application No. 106115736, dated Apr. 19, 2018, w/ First Office Action Summary.

(Continued)

*Primary Examiner* — Alexander Gee
(74) *Attorney, Agent, or Firm* — Nixon Peabody LLP; Zhou Lu (57) ABSTRACT

A system to record equipment location in an equipment rack is disclosed. The system includes a support frame having at least one slot. An identification label is located in proximity to the support frame. The identification label corresponds to the location of the slot. A device is installed in the at least one slot. An imaging sensor is coupled to the device and captures an image of the identification label.

20 Claims, 3 Drawing Sheets

(56) References Cited

U.S. PATENT DOCUMENTS

2015/0319879 A1    11/2015    Aimone

OTHER PUBLICATIONS

TW Search Report for Application No. 106115736 (report conducted Apr. 12, 2018) mailed with First Office Action dated Apr. 19, 2018.
JP Office Action for Application No. 2017-187780, dated Oct. 16, 2018, w/ First Office Action Summary.

* cited by examiner

SYSTEM FOR DETERMINING DEVICE LOCATION DATA IN A DATA CENTER

TECHNICAL FIELD

The present disclosure relates generally to a device identification and location system for a data center. More particularly, aspects of this disclosure relate to using an image sensor attached to a device to obtain and transmit the physical location of a rack mounted device in a data center.

BACKGROUND

The emergence of the cloud for computing applications has increased the demand for off-site installations termed data centers that store data and run applications accessed by remotely connected computer device users. Such data centers typically have massive numbers of servers, switches and storage devices to store and manage data so it may be accessed in a convenient manner by remote computer users. Typically a data center has physical rack structures with attendant power and communication connections. The racks are arranged in rows throughout the room or rooms of the data center. Each rack includes a frame that has vertically oriented slots that may hold multiple devices such as servers, switches and storage devices. There are many such devices stacked in such rack structures found in a modern data center. For example, some data centers have tens of thousands of servers and attendant storage devices and network switches. Thus, a typical data center may include tens of thousands or even hundreds of thousands of devices in hundreds or thousands of individual racks. Data centers typically have an administrative system in a control center to monitor and insure proper operation of the equipment. For management purposes, an administrator would like to have instantaneous knowledge of the location of devices in the rack and the location of rack in the data center. Such information must be obtained and recorded when the data center is set up, when equipment is replaced, or when new racks of devices are added to the data center.

Knowledge of the location of specific equipment in such racks is necessary for monitoring, maintenance, troubleshooting and replacement of data center equipment. When such equipment is installed, the location of the equipment must be recorded for such future reference. The current methods for identifying the locations of equipment and the corresponding rack include manual inspection, cable routing, or hardware ID. One of these methods must be employed by data center personnel when new equipment is installed or when new racks or equipment are installed.

Each of these existing methods suffers from problems due to the sheer size and scale of the modern data center. Traditional labeling of rack slots for manual inspection and recording is cumbersome as such information is physically at the location of the equipment in the form of a label, but must be recorded by personnel using a separate device such as a bar code reader and then converted to a data format for later access at a control station. Installers must spend time to find the correct label and physically record the equipment, either by inputting the information into an electronic device such as a tablet or even by hand for each rack that is installed. Such procedures are also susceptible to human error in recording the label or even forgetting to record certain installed equipment.

Cable routing requires identification of equipment by activation of a switch plugged into a port on the equipment. This is a time consuming process and is also susceptible to human error. Hardware ID requires one or more backplane boards installed in the rack to have a microcontroller or specialized circuit and a connector. The microcontroller or circuit will report the location ID of rack to the inserted identification equipment via the connector. However, these backplane boards and equipment with this connector are incompatible with current standard design of rack and devices and require extra cost. Further, hardware ID and cable routing both require the devices in the rack to be powered before determination of the location thereby adding additional time to installation.

Thus, there is a need for a system to allow efficient recording of the location of equipment and racks in a data center. There is also a need for a system that allows automatic recording and transmission of location information of newly installed equipment on racks to a remote location. There is a further need for an efficient mechanism for recording identification and location data for equipment during installation in a data center that may be performed automatically upon powering of the installed equipment.

SUMMARY

One disclosed example is a system to record device location in an equipment rack. The system includes a rack frame having at least one slot and a label in proximity to the rack frame, the label corresponding to the location of the slot. A device is installed in the at least one slot. An imaging sensor is coupled to the device. The imaging sensor captures an image of the label.

Another example is a method of remotely determining the location of devices in an equipment rack. A label is affixed in proximity to a slot on the rack. The label includes location information of the slot. A device is installed in the slot. An image of the label is captured via an imaging sensor. The image of the label is sent to a management controller in the device. The location of the slot is determined based on the image.

Another example is a device for a data center that allows automatic recording of a corresponding slot location on an equipment rack. The device includes an imaging sensor that captures an image of a label on the equipment rack corresponding to a slot that the device may be installed in. A management controller is coupled to the imaging sensor. The management controller is operable to capture an image of the label when the device is installed in the slot. The management controller determines the location of the slot from the captured image.

The above summary is not intended to represent each embodiment or every aspect of the present disclosure. Rather, the foregoing summary merely provides an exemplification of some of the novel aspects and features set forth herein. The above features and advantages, and other features and advantages of the present disclosure, will be readily apparent from the following detailed description of representative embodiments and modes for carrying out the present invention when taken in connection with the accompanying drawings and the appended claims.

BRIEF DESCRIPTION OF THE DRAWINGS

The disclosure will be better understood from the following description of exemplary embodiments together with reference to the accompanying drawings, in which.

The present disclosure is susceptible to various modifications and alternative forms, and some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. There are shown in the drawings, and will herein be described in detail, representative embodiments with the understanding that the present disclosure is to be considered as an exemplification or illustration of the principles of the present disclosure and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed: the singular includes the plural and vice versa; and the word "including" means "including without limitation." Moreover, words of approximation, such as "about," "almost," "substantially," "approximately," and the like, can be used herein in the sense of "at, near, or nearly at," or "within 3-5% of," or "within acceptable manufacturing tolerances," or any logical combination thereof, for example.

Figure 1:
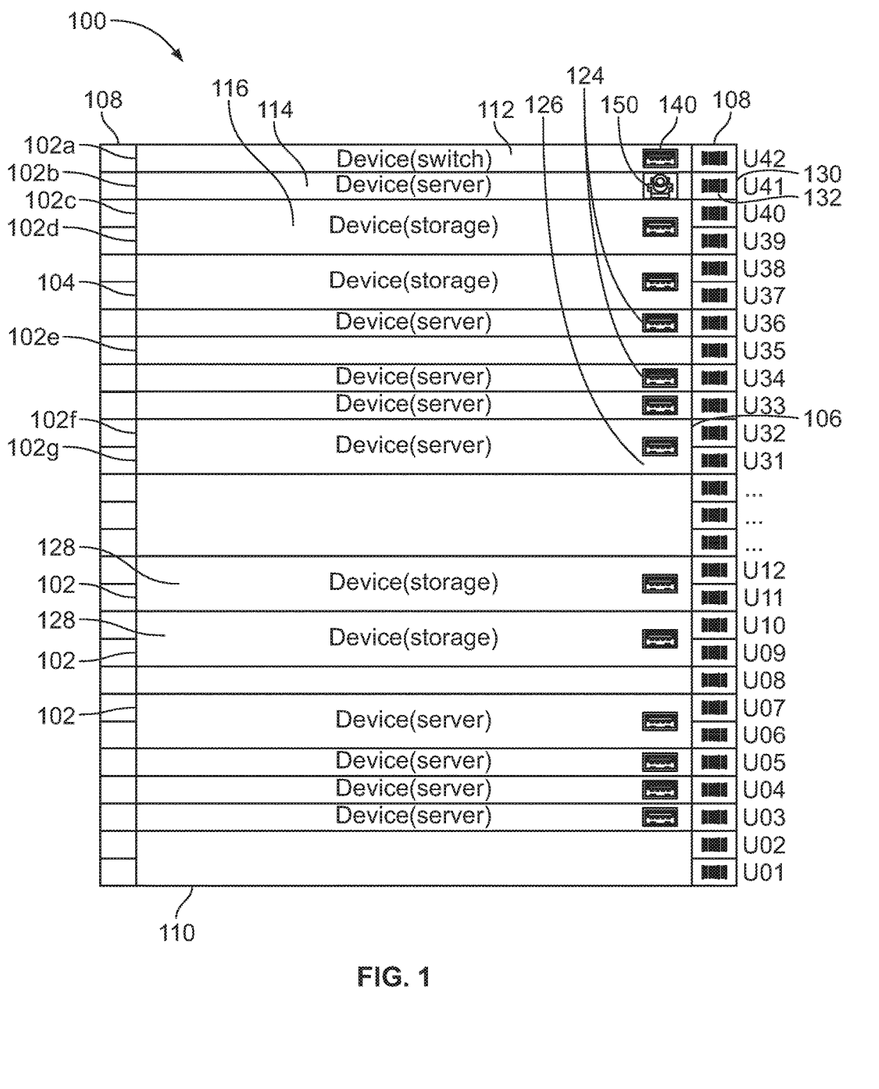
FIG. 1 shows an equipment rack in a data center with an example equipment location and identification system.

FIG. 1 shows an equipment rack 100 that may reside in a data center. The equipment rack 100 includes a rack frame 110 having a number of slots 102. Each of the slots 102 may hold at least one device associated with the data center. The rack frame 110 includes sidewalls 104 and 106 that include mounting slots or holes that allow attachment of support rails for the installation of devices in the slots 102. The sidewalls 104 and 106 are recessed and a pair of side panels 108 extend from the sidewalls 104 and 106 to recess the rack frame 110. The side panels 108 are arranged at an angle relative to the sidewalls 104 and 106 but it is to be understood that the side panels 108 may at any angle or may not be present if the device is flush with the sidewalls 104 and 106. In this example, FIG. 1 is a view of the front of the rack frame 110, but the location identification system described below may also be incorporated to the back of the rack frame 110.

In this example, the rack frame 110 includes 42 separate slots designated U1-U42. Of course, the rack frame 110 may include fewer or more slots. Each of the slots 102 may hold one device or more devices. Alternatively, a larger device may occupy two or more slots. Of course certain slots 102 may be unoccupied by devices. For example, one type of device in a slot 102a identified as U42 is a network switch 112. Another type of device in another slot 102b identified as U41 is a server device 114. A third type of device in two slots 102c and 102d identified as U40 and U39 is a storage device 116. Certain slots such as a slot 102e identified as U35 may be vacant. As shown in FIG. 1, other servers 124 may occupy other slots 102. The servers 124 may include other types of servers that require two slots such as the server 126 that is installed in slots 102f and 102g identified as U32 and U31. Other storage devices 128 may be installed in other slots.

Each of the slots 102 has a corresponding label area such as a label area 130 in proximity to the slot 102b. In this example, the label area 130 may be on an adjacent surface on the side panel 108 on the rack frame 110. The label area 130 includes an affixed label 132 in proximity to the corresponding slot such as slot 102b that includes identification and location information such as the slot location and the rack identification in the form of a bar code. In this example, the label 132 may include identification location information relating to number of the slot 102b as well as the identification of the rack and the room the rack is installed. Specifically, the label 132 corresponds to the slot 102b that holds the server device 114. The labels or stickers such as the label 132 on the rack frame 110 include location information relating to the slot 102b and identification information relating to the equipment rack 100 itself. For example, the information may be the mounting location of the slot 102b (e.g. U41), and/or the rack identification (e.g., rack #5), and/or room identification in data center (e.g., room #8), etc. The format of location and identification information may be a number, character string, bar code, QR code, or other image that is readily ascertainable by visual inspection. The labels such as the label 132 are applied to areas in proximity to the respective slots 102 of the rack frame 110 prior to the installation of the equipment rack 100 in the data center.

Each of the devices such as the switch 112, server 114 and storage device 116 includes a connection port such as the connection port 140 in the switch 112 that is in proximity to the respective label area 130 when the equipment is inserted into the corresponding slot 102. In this example, the connection port 140 is a USB port, but other interconnection protocols may be used.

As shown in FIG. 1, an imaging sensor such as a portable digital camera 150 is inserted in a connection port of the server 114. In this example, the portable digital camera 150 is a USB device drawing power from the USB connection port as well as transmitting data information through a USB connector. The camera 150 is positioned to capture an image of the label 132. Thus, each of the corresponding connection ports on each of the installed devices such allow the insertion of the portable digital camera 150 in a position to capture an image of the corresponding label associated with the slot 102 when the device is installed in the slot 102.

Although the example in FIG. 1 shows a label for each slot, one label could be applied for multiple slots. Also, the imaging sensor such as the camera 150 may be able to capture information from multiple labels corresponding to different slots other than the device the camera 150 is currently attached to. Of course other types of devices installed to other support equipment could also use the location identification system to determine the location. Further, the label for the slots 102 may be affixed in other locations on the rack 100. In such a case, appropriate adjustments may be made for the physical camera configuration or the location of the connection port in order for the camera to be in proximity to the label to capture an image of the label. Other types of sensor systems such as an RFID tag with location information on the rack and an RFID reader having a USB connector to read the RFID tag may be used instead of the label and image sensor.

Figure 2A:
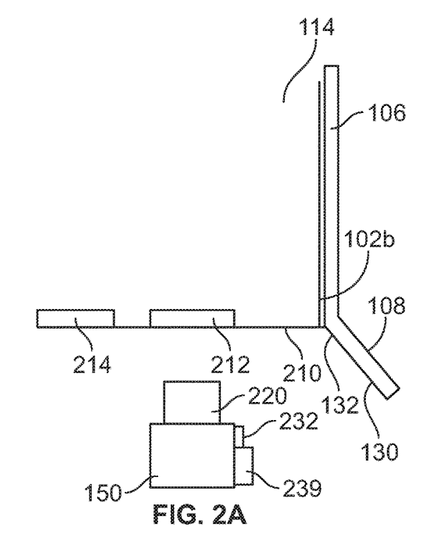
FIG. 2A is a close up top down view of one of the devices in the equipment rack and a location label shown in FIG. 1 prior to insertion of the camera.

FIG. 2A is a close up top perspective view of the slot 102b in the rack frame 110 shown in FIG. 1. The rack frame 110 includes the side wall 106 that provides support for the server 114 installed in the slot 102b. In this example, the panel 108 is angled between the edges of the rack 100 and the edge of the frame 110. The panel 108 includes the area 130 with the label 132 in proximity to the slot 102b. The panel 108 may be angled at any appropriate angle relative to the slot 102b as long as the sensing device such as the camera 150 can capture an image of the label 132 on the panel 108. The slot 102b shown in FIG. 2 is designated as the physical location corresponding to the server 114. In this example, the server 114 has a front panel 210 that includes a USB port 212 that serves as one of the connection ports such as the connection port 140 in FIG. 1. It is to be understood that the front panel 210 also includes other connection ports 214 that allow connection of different cables. Of course, the present principles of using an imaging device such as a camera to capture the label information may be applied to the back of the rack frame 110 or the side walls of the rack frame 110 as long as such surfaces may be viewed by the camera 150.

In this example, the side panel 108 is angled from the front panel 210 of the server 114 when the server 114 is installed in the slot 102. Of course there may be other configurations of the rack frame 110 in FIG. 1 such as where the side panel 108 is perpendicular to the front panel 210. As may be seen in FIG. 2A, the label 132 corresponding to the particular slot is applied to the side panel 108 in proximity to the slot 102b before the rack 100 is installed. FIG. 2A shows the camera 150 in FIG. 1 prior to insertion into the USB port 212. The camera 150 has a USB connector 220 that may be plugged into the USB port 212 of the server 114. The camera 150 includes a camera lens 230 that is oriented perpendicularly to the USB connector 220. An optional flash 232 next to the lens 230 may be part of the camera 150 to provide additional light to assist in capturing the image of the label 132. In this example, the flash 232 is an LED type flash, but other light sources may be used.

Figure 2B:
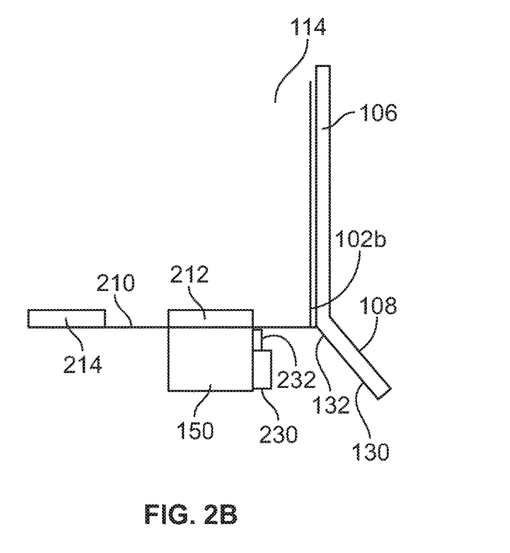
FIG. 2B is a close up top down view of the device in FIG. 2A when the camera is inserted to capture an image of the location label.

As shown in FIG. 2B, the camera 150 may be attached to the server 114 by inserting the USB connector 220 into the USB port 212. Typically, the camera 150 is attached to the server 114 when the server 114 is installed in the slot 102b. As shown in FIG. 2B, the insertion of the camera 150 orients the lens 230 to face the label 132 on the side panel 108. The camera 150 may then be enabled to capture an image of the label 132.

Figure 3:
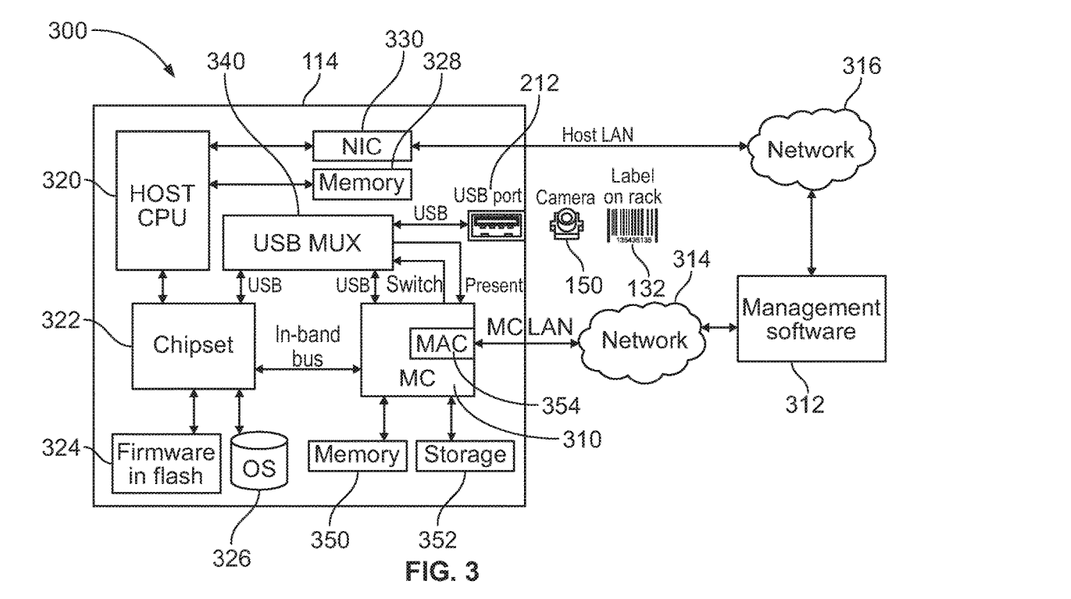
FIG. 3 is a block diagram of the equipment location and identification system in FIG. 1.

FIG. 3 shows a block diagram of an example identification system 300 that uses a management controller 310 in a rack mounted device such as the server 114 in FIG. 1. The identification system uses the camera 150 to capture the rack related location information on the label 132 and send the location and corresponding equipment identification to a control center 312 for the data center. As shown in FIG. 3, the captured identification location information is sent to the control center 312 via an out of band network 314. The server 114 is also connected to other network devices via an in band network 316 that may be a local area network. The in band network 316 may also include the control center 312.

The network 314 may be a local area network environment employing any suitable interface mechanisms and communications technologies including, for example telecommunications in any suitable form (e.g., voice, modem, and the like), Public Switched Telephone Network (PSTNs), Ethernet-based Packet Data Networks (PDNs), combinations thereof, and the like. Moreover, local area networks may be made up of one or more interconnected LANs located in substantially the same geographic location or geographically separated, although the local area networks may include other types of networks arranged in other configurations. Moreover, the local area networks may include one or more additional intermediary and/or network infrastructure devices in communication with each other via one or more wired and/or wireless network links, such as switches, routers, modems, or gateways (not shown), and the like, as well as other types of network devices including network storage devices.

The server 114 shown in FIG. 3 includes a host CPU 320, an input/output interface bus 322, a flash memory 324 that includes firmware for different applications, permanent memory such as ROM for operation system software 326, a rewritable memory 328 that may be, for example, a hard drive, SRAM or DRAM and a network interface controller 330 that allows communication between the CPU 320 and the in-band network 316. The different USB ports such as the USB port 212 are connected to a USB multiplexer 340 that allows the components of the server 114 to connect to the different USB ports. The management controller 310 includes a separate rewritable memory 350 and permanent memory 352 for application software. The management controller also includes a media access control (MAC) controller 354 that allows communication between the management controller 310 and the network 314. In this example, the management controller 310 is a baseboard management controller that is part of the server 114. Of course, it is understood that any suitable controller may be used for the management controller 310. For example, the functions of the management controller 310 may be performed by the host CPU 320.

In this example, the camera 150 is a small compact USB based modular device that may be inserted into a USB port such as the USB port 212. Alternatively, the devices on the rack frame 110 such as the server 114 may include a camera for location identification purposes. It is to be understood that any type of imaging sensor in conjunction with a tag may be used for the location identification system in FIG. 3. The USB port 212 in the device such as the server 114 is in close proximity to the label 132 when the device is mounted in one of the slots 102 in the rack frame 110. The inserted camera 150 thus may capture the location information on the label 132 when a device with the camera 150 attached is installed in the slot 102. In order to share the same USB port, the USB port signals connect to both the management controller 310 and a host system run by the host CPU 320 via the USB multiplexer 340 or a separate USB microcontroller. The management controller 310 can control the multiplexer 340 to switch the USB port connection to the management controller 310 or to the host system. This control can be one or more output pins connected from the management controller 310 to the multiplexer 340 or a command or setting communicated from the management controller 310 to the micro-controller. By default, the USB port 212 in this example connects to the management controller 310.

A pin or signal on the main board of the server 114 from the USB multiplexer 340 indicates whether the USB device such as the camera 150 is present or absent or is inserted or removed from the USB port 212. The management controller 310 accesses operating firmware code stored in the permanent memory 352 to operate the camera 150. The firmware code is executed by the management controller 310 to detect whether the USB device is present or absent by reading and checking whether the inserted USB device is a camera or not. The firmware code is also executed by the management controller 310 to detect whether the camera 150 is inserted or removed according to the hardware signal above. For example, the USB multiplexer 340 will pull this pin/signal to a high level to the management controller 310 when the USB device is absent and pull the pin/signal to a low level when the USB device is present. The firmware code also allows the management controller 310 to change USB port signals connection from the management controller 310 to the host system operated by the host CPU 320 by controlling the USB multiplexer 340.

When the camera 150 is successfully inserted and recognized by the management controller 310, the firmware code enables the camera 150 by initializing operation and activating driver code for the upper layers of software code for the camera 150. The code allows the management controller 310 to activate the camera 150 to capture the image of the label 132 to obtain the location information on the label 132. In this example, the firmware code is executed by the management controller 310 to translate the captured image to location information then store the location information to the memory 350. After successful capture of the image of the label, the management controller 310 may then disable the camera 150 to save power. In this example, the firmware code may include an application for reading barcodes and translating the barcode into the location and identification data such as the rack identification, slot location and room identity. Of course if the label includes information in other formats such as alpha-numerical characters or a QR code, the firmware code may include an appropriate application such as optical character recognition or QR code translation.

The control center 312 may use management software to interrogate each of the devices on a rack such as the rack 100. For example, the control center 312 may interrogate the server device 114 to send the identification information along with corresponding identification and location information of the slot, rack and room associated with the server device 114 over the network 314. In this manner, the control center 312 may create a record of all the equipment and associated location (slot, rack and room) as it is installed on a particular rack such as the rack 100 in FIG. 1. The management software of the control center 312 may use the obtained location identification data to show the device configuration or topology of the rack 100 in the data center. Alternatively, the firmware code executing in the management controller 310 may initiate the communication to the control center 312 over the network 314. The device identification and corresponding location information may be provided via in-band (from the host system operated by the host CPU 320) via the network interface controller 330 through the network 316 or out-of-band (through the network 314). Thus, the in-band network 316 may provide an alternative way to communicate identification and location information when the out-of-band network 314 is not accessible by the management controller 310.

In the course of installing new equipment on the rack 100 to fill an empty slot or to replace existing device, the new device with corresponding rack, slot and room location information may automatically be determined by the management software in the control center 312 in conjunction with the corresponding management controller in the newly installed device. The camera 150 may be repeatedly used by moving the camera 150 to each device mounted in a newly installed rack and plugging it into the USB port. After the location and identification data from the label is captured and recorded, the camera 150 may be moved to the next device mounted in the rack and the process of capturing an image of label and sending the location information and the identification of the device to the control center is repeated. The management software in the control center 312 may thus be supplied with location identification information relating to each device in a newly installed rack without relying on additional equipment and/or actions by installer personnel.

Figure 4:
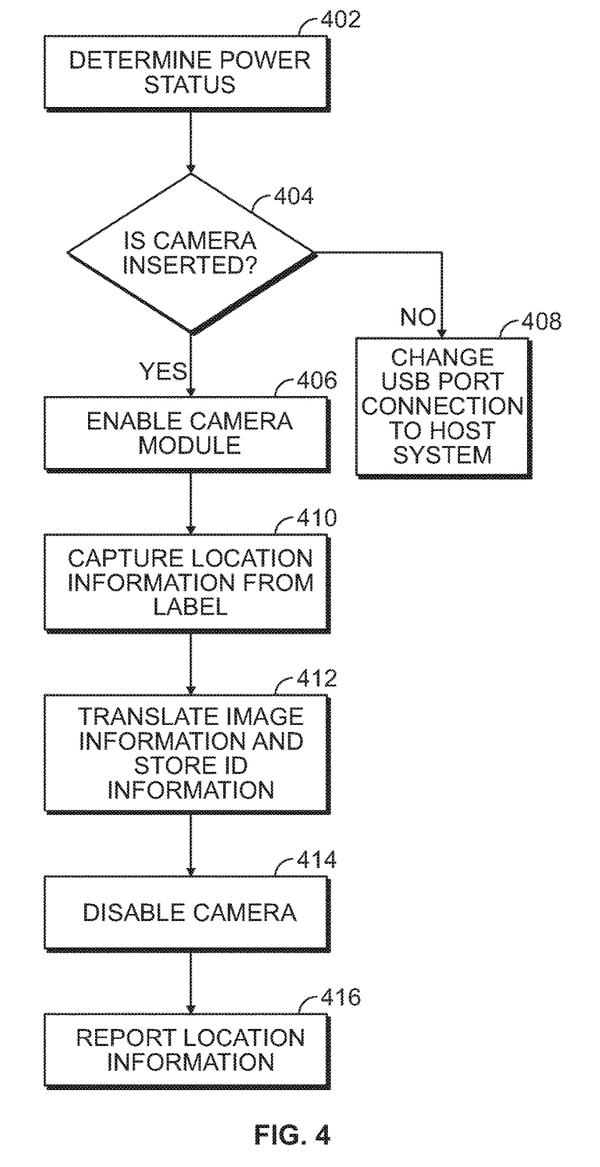
FIG. 4 is a flow diagram of the process of determining the location and identification of rack equipment via the system shown in FIG. 1 where the camera is removable from a device.

FIG. 4 shows a flow diagram of the code executed by the management controller 310 to capture the location information using an insertable imaging sensor such as the camera 150 in FIG. 1. The flow diagram in FIG. 4 is representative of example machine readable instructions for the identification system 300 in FIG. 3. In this example, the machine readable instructions comprise an algorithm for execution by: (a) a processor, (b) a controller, and/or (c) one or more other suitable processing device(s). The algorithm may be embodied in software stored on tangible media such as, for example, a flash memory, a CD-ROM, a floppy disk, a hard drive, a digital video (versatile) disk (DVD), or other memory devices, but persons of ordinary skill in the art will readily appreciate that the entire algorithm and/or parts thereof could alternatively be executed by a device other than a processor and/or embodied in firmware or dedicated hardware in a well-known manner (e.g., it may be implemented by an application specific integrated circuit (ASIC), a programmable logic device (PLD), a field programmable logic device (FPLD), a field programmable gate array (FPGA), discrete logic, etc.). For example, any or all of the components of the interfaces could be implemented by software, hardware, and/or firmware. Also, some or all of the machine readable instructions represented by the flowchart of FIG. 4 may be implemented manually. Further, although the example algorithm is described with reference to the flowcharts illustrated in FIG. 4, persons of ordinary skill in the art will readily appreciate that many other methods of implementing the example machine readable instructions may alternatively be used. For example, the order of execution of the blocks may be changed, and/or some of the blocks described may be changed, eliminated, or combined.

The management controller 310 first determines whether the server device 114 is powered on reset or is in operation mode (402). The management controller 310 then determines whether the camera 150 is inserted in the port of the device (404). If the camera 150 is plugged into the USB port, the management controller 310 proceeds to enable the camera 150 (406). If no camera is inserted in the port, the management controller 310 changes the USB port connection to the host system of the device via sending a signal or command to the USB multiplexor 340 (408). The management controller 310 may also send an indication to the host CPU 320 that it is unable to capture an image of the label and the CPU 320 may then send a message informing the control center 312 in FIG. 3.

The management controller 310 commands the camera 150 to capture the image of location and identification information on the label that is in proximity to the camera 150 (410). The management controller 310 translates the captured image to location information and stores the location information to its memory (412). The management controller 310 then disables the camera 150 to save its power consumption if needed (414).

The management software at the control center 312 sends requests to the management controller 310 of the device. The management controller 310 responds by sending the location and identification information obtained from the label via in-band (system bus) or out-of-band (network) (416). Alternatively, the management controller 310 may initiate the communication of the location and identification information to the control center 312. One of the management controller 310, the host processor 320 or the management software at the control center 312 matches the obtained location information with identification information such as a serial number, a MAC address, etc. of the device. The management software in the control center 312 may report or show the location information and associated device to a user for general data center operation purposes. Of course, such location and identification information may be displayed in any convenient format such as a table or a visual graphic.

Figure 5:
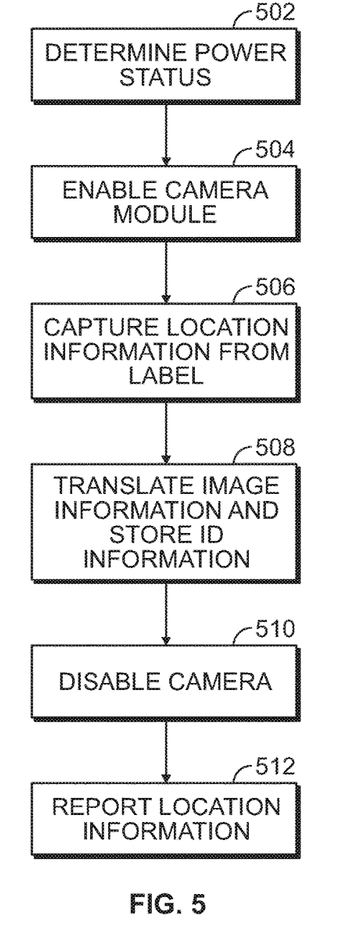
FIG. 5 is a flow diagram of the process of determining the location and identification of rack equipment via the system shown in FIG. 1 when the camera is part of the device.

FIG. 5 shows a flow diagram of the code executed by the management controller 310 to capture the location information using an imaging sensor such as a camera that is part of the device installed in a rack. The management controller 310 first determines whether the server device 114 is powered on reset or is in operational mode (502). The management controller 310 then enables the camera (504).

The management controller 310 commands the camera to capture the image of location and identification information on the label that is in proximity to the camera (506). The management controller 310 translates the captured image to location information and stores the location information to its memory (508). The management controller 310 then disables the camera to save its power consumption if needed (510).

The management software at the control center 312 sends requests to the management controller 310 of the device. The management controller 310 responds by sending the location and identification information obtained from the label via the in-band (system bus) or out-of-band (network) (512). Alternatively, the management controller 310 may initiate the communication of the location and identification information to the control center 312. One of the management controller 310, the host processor 320 or the management software at the control center 312 matches the obtained location information with identification information such as a serial number, a MAC address, etc. of the device.

As used in this application, the terms "component," "module," "system," or the like are generally intended to refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

Computing devices typically include a variety of media, which can include computer-readable storage media and/or communications media, in which these two terms are used herein differently from one another as follows. Computer-readable storage media can be any available storage media that can be accessed by the computer, is typically of a non-transitory nature, and can include both volatile and nonvolatile media, removable and non-removable media. By way of example, and not limitation, computer-readable storage media can be implemented in connection with any method or technology for storage of information such as computer-readable instructions, program modules, structured data, or unstructured data. Computer-readable storage media can include, but are not limited to, RAM, ROM, EEPROM, flash memory or other memory technology, CD-ROM, digital versatile disk (DVD) or other optical disk storage, magnetic cassettes, magnetic tape, magnetic disk storage or other magnetic storage devices, or other tangible and/or non-transitory media which can be used to store desired information. Computer-readable storage media can be accessed by one or more local or remote computing devices, e.g., via access requests, queries or other data retrieval protocols, for a variety of operations with respect to the information stored by the medium.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A system to record device location in an equipment rack, the system comprising:
   a rack frame having at least one slot;
   a label in proximity to the rack frame, the label corresponding to the location of the slot;
   a device installed in the at least one slot;
   a sensor coupled to the device, the sensor detecting the label to determine the location of the slot; and
   a management controller coupled to an imaging sensor, the management controller operable to determine that the device is in an operation mode; in an event that a sensor is connected to a USB port of the device, enable the sensor; cause the sensor to capture the location information of the label; determine the location of the slot based on the image; in an event that no camera is attached to the USB port, send a command to a USB multiplexor to change the USB connection to a host system of the device; and send an indication to a host CPU of the device, wherein the indication causes the host CPU to inform a control center that the location information of the label is unavailable.

2. The system of claim 1, wherein the sensor is an imaging sensor capturing an image of the label.

3. The system of claim 2, wherein the imaging sensor is a digital camera.

4. The system of claim 1, wherein the management controller includes a network interface to transmit the determined location information to the remote control center for a data center, wherein the control center determines identification of the device and associates the determined location information with the identification of the device.

5. The system of claim 1, wherein the device is one of a server, a storage device or a network switch.

6. The system of claim 1, wherein the rack frame has multiple slots, each slot accommodating at least one device.

7. The system of claim 2, wherein the label is formatted in one of alpha-numeric characters, QR code or a bar code.

8. The system of claim 1, wherein the sensor interfaces with the device via a USB port.

9. The system of claim 1, wherein the imaging sensor is removable from the device.

10. The system of claim 1, wherein the label includes identification information on at least one of the rack and a room where the rack is located.

11. A method of remotely determining the location of devices in an equipment rack, the method comprising:
    affixing a label in proximity to a slot on the rack, wherein the label includes location information of the slot;
    installing a device in the slot;
    determining that the device is in an operation mode;
    in an event that a sensor is connected to a USB port of the device, enabling the sensor;
    capturing the location information of the label via the sensor;
    sending the location information of the label to a management controller in the device;
    determining the location of the slot based on the image;
    in an event that no camera is attached to the USB port, sending a command to a USB multiplexor to change the USB connection to a host system of the device; and
    sending an indication to a host CPU of the device, wherein the indication causes the host CPU to inform a control center that the location information of the label is unavailable.

12. The method of claim 11, wherein the sensor is an imaging sensor and capturing the location information of the label includes capturing an image of the label and wherein sending the location information includes sending the image of the label to a management controller in the device.

13. The method of claim 12, wherein the imaging sensor is a digital camera.

14. The method of claim 11, further comprising:
    transmitting the determined location information to a remote control center for a data center via a network interface of the management controller;
    determining identification of the device; and
    associating the determined location information with the identification of the device.

15. The method of claim 11, wherein the device is one of a server, a storage device or a network switch.

16. The method of claim 11, wherein the rack frame has multiple slots, each slot accommodating at least one device.

17. The method of claim 12, wherein the label is formatted in one of alpha-numeric characters, QR code or a bar code.

18. The method of claim 11, wherein the sensor interfaces with the device via a USB port.

19. The method of claim 12, wherein the imaging sensor is removable from the device, the method further comprising:
    removing the imaging sensor from the device,
    inserting the imaging sensor into another device in another slot;
    capturing an image of another label associated with the another slot via the imaging sensor;
    sending the image of the another label to a management controller in the another device; and
    determining the location of the another slot based on the image.

20. The method of claim 11, wherein the label includes identification information on at least one of the rack and a room where the rack is located.

* * * * *